US011190284B2

(12) United States Patent
Bartko et al.

(10) Patent No.: US 11,190,284 B2
(45) Date of Patent: Nov. 30, 2021

(54) SWITCHING SYSTEM AND METHOD FOR SEQUENTIAL SWITCHING OF RADIO FREQUENCY PATHS

(71) Applicant: Rohde & Schwarz GmbH & Co. KG, Munich (DE)

(72) Inventors: Hendrik Bartko, Unterhaching (DE); Werner Rohde, Munich (DE); Gert Heuer, Aufkirchen (DE); Bernhard Rohowsky, Raubling (DE); Michael Kunert, Erding (DE)

(73) Assignee: Rohde & Schwarz GmbH & Co. KG, Munich (DE)

(*) Notice: Subject to any disclaimer, the term of this patent is extended or adjusted under 35 U.S.C. 154(b) by 0 days.

(21) Appl. No.: 16/447,678

(22) Filed: Jun. 20, 2019

(65) Prior Publication Data
US 2020/0403714 A1 Dec. 24, 2020

(51) Int. Cl.
*H04B 17/15* (2015.01)
*H04B 17/29* (2015.01)
*H04B 17/19* (2015.01)
*G01R 29/10* (2006.01)

(52) U.S. Cl.
CPC ........... *H04B 17/15* (2015.01); *G01R 29/10* (2013.01); *H04B 17/29* (2015.01)

(58) Field of Classification Search
CPC ...... H04B 17/15; H04B 17/29; H04B 17/192; H04B 17/14; H04B 17/21; G01R 29/10; H01Q 21/24; H01Q 1/24; H01Q 3/26
See application file for complete search history.

(56) References Cited

U.S. PATENT DOCUMENTS

| 6,252,542 B1* | 6/2001 | Sikina | H01Q 3/267 342/174 |
| 8,193,506 B2* | 6/2012 | Gebhardt | A61B 6/032 250/363.04 |

(Continued)

FOREIGN PATENT DOCUMENTS

| DE | 199 28 428 A1 | 1/2001 | |
| DE | 19928428 A1 * | 1/2001 | ......... G01R 33/3621 |

(Continued)

OTHER PUBLICATIONS

R&S OSP Open Switch and Control Platform, Modular Solution for RF Switch and Control Tasks, Product Brochure, Version 02.00, Nov. 2018, retrieved from https://scdn.rohde-schwarz.com/ur/pws/dl_downloads/dl_common_library/dl_brochures_and_datasheets/pdf_1/service_support_30/OSP_model_2018_bro_en_5216-1340-12_v0200.pdf, pp. 1-8.

*Primary Examiner* — Pablo N Tran
(74) *Attorney, Agent, or Firm* — Ditthavong, Steiner & Mlotkowski

(57) ABSTRACT

A switching system for sequential switching of radio frequency paths is provided. The switching system comprises a plurality of inputs and a plurality of outputs, a plurality of switching elements respectively connected between the plurality of inputs and the plurality of outputs and a trigger module. In this context, multiple signal paths are defined between the plurality of inputs and the plurality of outputs corresponding to specific switch positions of the plurality of switching elements. In addition, the trigger module is adapted to generate a trigger signal in order to switch between the multiple signal paths.

16 Claims, 4 Drawing Sheets

(56) References Cited

U.S. PATENT DOCUMENTS

Figure 1:
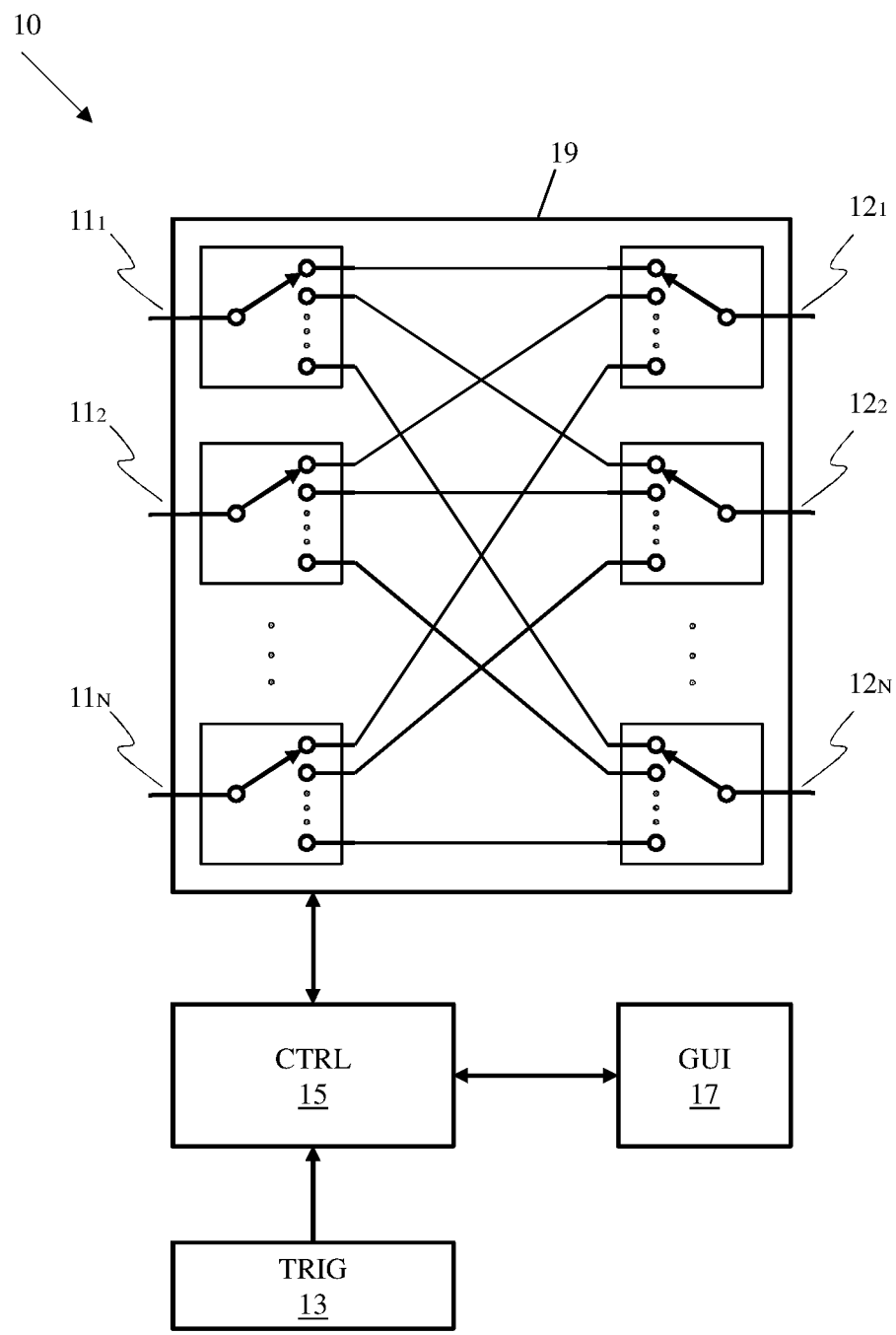

| | | | | |
|---|---|---|---|---|
| 8,391,377 | B2 * | 3/2013 | Zhu | H04B 17/11 |
| | | | | 375/259 |
| 9,692,530 | B2 * | 6/2017 | O'Keeffe | H01Q 21/24 |
| 10,128,894 | B1 * | 11/2018 | O'Brien | H04B 17/14 |
| 2003/0076115 | A1 * | 4/2003 | Yamasaki | G01R 13/20 |
| | | | | 324/601 |
| 2013/0260844 | A1 * | 10/2013 | Rucki | H04M 1/026 |
| | | | | 455/575.7 |
| 2018/0212695 | A1 | 7/2018 | Kyrolainen et al. | |

FOREIGN PATENT DOCUMENTS

| | | | | |
|---|---|---|---|---|
| DE | 102004055939 A1 * | 5/2006 | ......... | H01H 59/0009 |
| DE | 10 2004 055 939 B4 | 5/2007 | | |
| EP | 0 286 366 A2 | 10/1988 | | |
| EP | 2299774 A1 * | 3/2011 | ............. | H01Q 1/246 |
| WO | WO-2017074315 A1 * | 5/2017 | ........... | H05K 7/1498 |

\* cited by examiner

SWITCHING SYSTEM AND METHOD FOR SEQUENTIAL SWITCHING OF RADIO FREQUENCY PATHS

The invention relates to a switching system and a corresponding method for sequential switching of radio frequency paths, especially for rapid switching of different signal paths to ensure real-time synchronization with the external measurement setup.

Generally, a radio frequency switch matrix system routes a radio frequency signal from single or multiple measuring instruments to single or multiple devices under test. This allows multiple tests to be performed simultaneously as well as with the same test setup, eliminating the need for frequent connects and disconnects. Due to the increasing number of mobile communication systems, there is a strong demand in reducing the overall test time. As the complexity of mobile communication systems increases, the required test time also increases. Using a switch matrix system enables parallel testing of multiple devices under test, thereby reducing the overall test time drastically.

Furthermore, a switching receiver facilitates space diversity scheme that is especially effective at mitigating multipath situations in over the air measurements, since multiple antennas offer a receiver several observations of the same signal. The signal from only one antenna is fed to the receiver for as long as the quality of that signal remains above some prescribed threshold. If and when the signal degrades, another antenna is switched in.

For example, the document EP 0 286 366 A2 shows a space diversity receiving system which is capable of operating accurately over a wide range of received input electric field strength. In this regard, a search operation is started in response to an abrupt change of the received electric field strength or the production of a noise component such as a white noise. The antenna highest in received electric field strength is selected and the output of the antenna thus selected is applied to a receiver. However, such search operation slows down the antenna path switching due to the number of amplification stages of the automatic gain controller. Consequently, a real-time synchronization between the receiving system and antenna path switching is not possible.

Accordingly, the object of the invention is to provide a switching system and a method for sequential switching of radio frequency paths, especially for allowing rapid switching between the radio frequency signal paths even at unpredictable times in order to achieve real-time synchronization between the external measurement setup and path switching.

The object is solved by the features of the first independent claim for the system and by the features of the second independent claim for the method. The dependent claims contain further developments.

According to a first aspect of the invention, a switching system for sequential switching of radio frequency paths is provided. The switching system comprises a plurality of inputs and a plurality of outputs, a plurality of switching elements respectively connected between the plurality of inputs and the plurality of outputs and a trigger module. In this context, multiple signal paths are defined between the plurality of inputs and the plurality of outputs corresponding to specific switch positions of the plurality of switching elements. In addition, the trigger module is adapted to generate a trigger signal in order to switch between the multiple signal paths. Therefore, a signal path is defined based on a specific switch position of one or more switching elements. The plurality of inputs can connect to any of the plurality of outputs through a corresponding switch position which advantageously enables multiple active signal paths. In addition, a trigger signal is generated so as to switch several different signal paths very quickly, especially at unpredictable times to ensure real-time synchronization with the external measurement setup.

According to a first preferred implementation form of said first aspect of the invention, the multiple signal paths are switched in a predefined path sequence. Advantageously, sequential path switching of the signal paths is achieved.

According to a second preferred implementation form of said first aspect of the invention, the switching system further comprises a control unit configured to examine the trigger signal with an adjustable threshold to identify a signal level change in order to detect the trigger signal. In this context, the switching system may comprise an analog or digital signal input, where a voltage corresponding to the generated trigger level is fed. The control unit compares the voltage level with an adjustable threshold for signal level change and when the voltage level passes the said threshold, the control unit detects the trigger signal. Advantageously, a simplified trigger detection mechanism is realized.

According to a further preferred implementation form of said first aspect of the invention, the control unit is further configured to switch a subsequent signal path corresponding to the predefined path sequence upon detecting the trigger signal. Advantageously, a simplified hardware based triggering of switching sequences is implemented.

According to a further preferred implementation form of said first aspect of the invention, the control unit is further configured to switch the multiple signal paths in real-time. Advantageously, real-time synchronization between the external measurement setup and path switching is ensured.

According to a further preferred implementation form of said first aspect of the invention, the control unit is further configured to reset the predefined path sequence of the multiple signal paths. Advantageously, the predefined path switching sequence can be reset and redefined with ease based on, for example, the functionalities that are required for a particular measurement setup. The reset may be further incorporated with a soft reset that is equivalent to a reboot and/or a hard reset that sets back to factory defaults.

According to a further preferred implementation form of said first aspect of the invention, the trigger module is further adapted to generate a number N of trigger signals. In addition, the multiple signal paths are assigned by $2^N$ location indexes. Advantageously, in addition to hardware based triggering of switching sequences, address based triggering is also incorporated.

According to a further preferred implementation form of said first aspect of the invention, the control unit is further configured to examine each number N of trigger signals with a respective adjustable threshold to identify signal level change in order to detect the number N of trigger signals. In this context, each number N of trigger signals are fed to the switching system in the form of corresponding voltage levels. The trigger signal voltage levels are compared with an adjustable threshold for signal level change in order to detect the trigger signals.

According to a further preferred implementation form of said first aspect of the invention, the control unit is further configured to switch a subsequent signal path corresponding to the $2^N$ location indexes upon detecting the respective number N of trigger signals. Therefore, multiple trigger signals directly address a specific signal path. The detected trigger signals correspond to a predefined switching sequence that is based on the location index of each signal path. For instance, a number of 4 trigger signals can correspond to a total of 16 ($2^4$) location indexes or signal paths that can be predefined in a sequential order. Once the trigger signals are detected, the corresponding sequence will start.

According to a further preferred implementation form of said first aspect of the invention, the switching system further comprises a user interface, preferably a graphical user interface. Advantageously, switching several different signal paths as well as resetting the switching sequence are performed with ease through direct manipulation of the graphical elements.

According to a further preferred implementation form of said first aspect of the invention, the control unit is further configured to output a ready signal on the user interface in order to indicate a correct switching from one signal path to the subsequent signal path. Advantageously, the switching reliability is significantly increased.

According to a second aspect of the invention, a method for sequential switching of radio frequency paths is provided. The method comprises the steps of defining multiple signal paths corresponding to specific switch positions of a plurality of switching elements and generating a trigger signal in order to switch between the multiple signal paths. Therefore, a signal path is defined based on a specific switch position of one or more switching elements and a trigger signal is generated so as to switch several different signal paths very quickly, especially at unpredictable times to ensure real-time synchronization with the external measurement setup.

According to a first preferred implementation form of said second aspect of the invention, the method further comprises the step of switching the multiple signal paths in a predefined sequence. Advantageously, sequential path switching of the signal paths is achieved.

According to a second preferred implementation form of said second aspect of the invention, the method further comprises the step of examining the trigger signal with an adjustable threshold to identify a signal level change in order to detect the trigger signal. Advantageously, a simplified trigger detection mechanism is realized.

According to a further preferred implementation form of said second aspect of the invention, the method further comprises the step of switching a subsequent signal path corresponding to the predefined path sequence upon detecting the trigger signal. Advantageously, a simplified hardware based triggering of switching sequences is implemented.

According to a further preferred implementation form of said second aspect of the invention, the method further comprises the step of switching the multiple signal paths in real-time. Advantageously, real-time synchronization between the external measurement setup and path switching is ensured.

According to a further preferred implementation form of said second aspect of the invention, the method further comprises the steps of generating a number N of trigger signals and assigning the multiple signal paths by $2^N$ location indexes. Advantageously, in addition to hardware based triggering of switching sequences, address based triggering is also incorporated.

According to a further preferred implementation form of said second aspect of the invention, the method further comprises the step of examining each number N of trigger signals with a respective adjustable threshold to identify signal level change in order to detect the number N of trigger signals. In this context, each number N of trigger signals are fed to the switching system in the form of corresponding voltage levels. The trigger signal voltage levels are compared with an adjustable threshold for signal level change in order to detect the trigger signals.

According to a further preferred implementation form of said second aspect of the invention, the method further comprises the step of switching a subsequent signal path corresponding to the $2^N$ location indexes upon detecting the respective number N of trigger signals. Therefore, multiple trigger signals directly address a specific signal path. The detected trigger signals correspond to a predefined switching sequence that is based on the location index of each signal path. For instance, a number of 4 trigger signals can correspond to a total of 16 ($2^4$) location indexes or signal paths that can be predefined in a sequential order. Once the trigger signals are detected, the corresponding sequence will start.

According to a further preferred implementation form of said second aspect of the invention, the method further comprises the step of outputting a ready signal in order to indicate a correct switching from one signal path to the subsequent signal path. Advantageously, the switching reliability is significantly increased.

Figure 2:
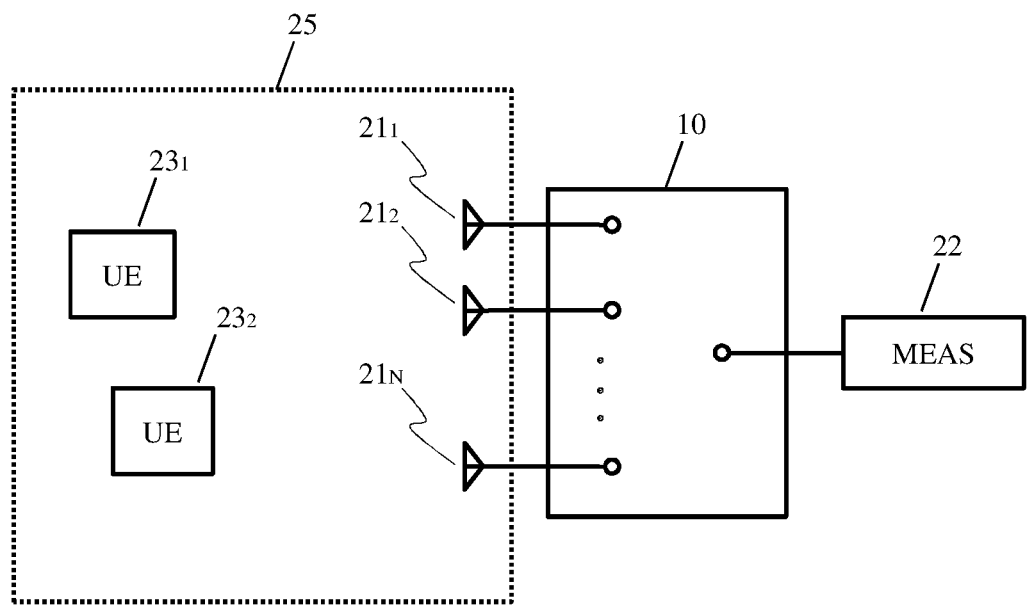
Figure 3:
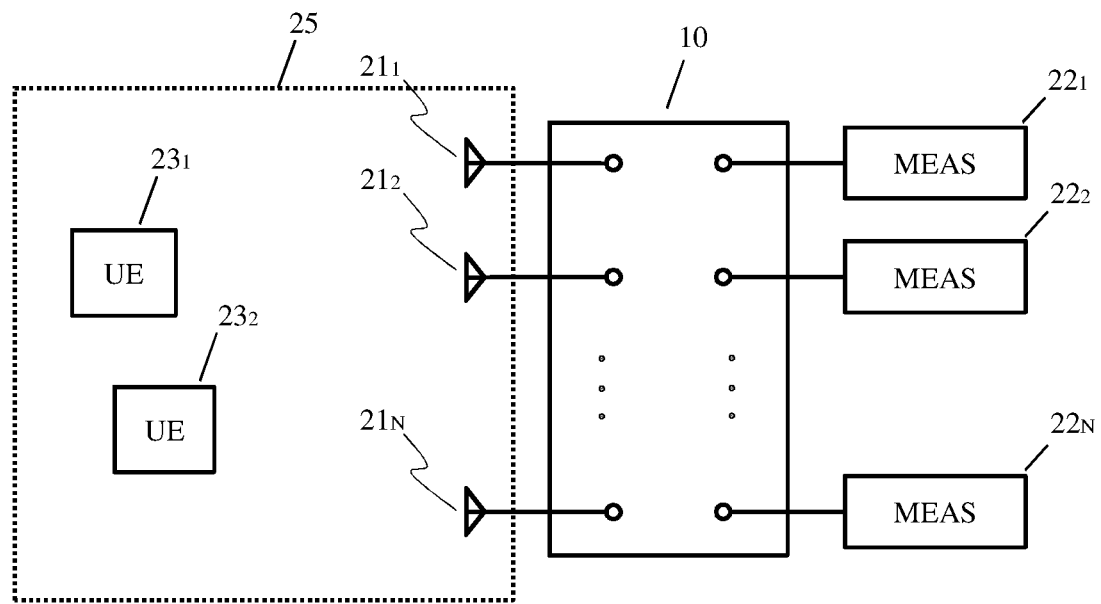
Figure 4:
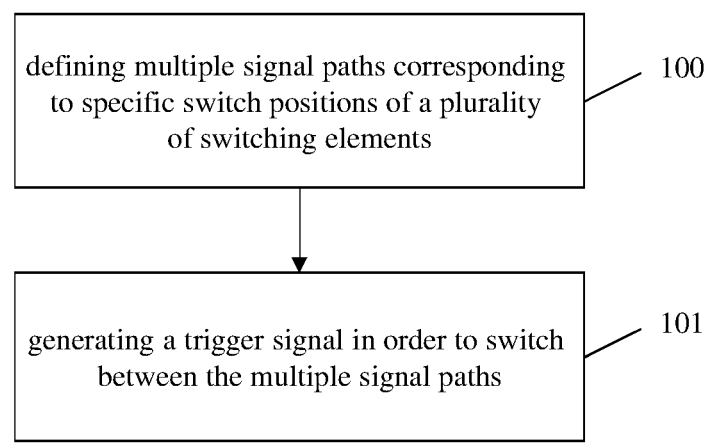

Exemplary embodiments of the invention are now further explained with respect to the drawings by way of example only, and not for limitation. In the drawings:

FIG. 1 shows a block diagram of the switching system according to the first aspect of the invention, FIG. 2 shows a first exemplary test setup of the switching system performing switching operation in over the air measurements, FIG. 3 shows a second exemplary test setup of the switching system performing switching operation in over the air measurements, and FIG. 4 shows a flow chart of an exemplary embodiment of the second aspect of the invention.

Reference will now be made in detail to the embodiments of the present invention, examples of which are illustrated in the accompanying drawings. Similar entities and reference numbers in different figures have been partially omitted. However, the following embodiments of the present invention may be variously modified and the range of the present invention is not limited by the following embodiments.

In FIG. 1, a block diagram of the switching system 10 according to the first aspect of the invention is illustrated. The switching system 10 comprises a plurality of inputs $11_1$, $11_2$, ..., $11_N$ and a plurality of outputs $12_1$, $12_2$, ..., $12_N$ where a plurality of switching elements are respectively connected between the inputs $11_1$, $11_2$, ..., $11_N$ and outputs $12_1$, $12_2$, ..., $12_N$. Signal paths are defined between the inputs $11_1$, $11_2$, ..., $11_N$ and outputs $12_1$, $12_2$, ..., $12_N$ based on the specific switch positions of the switching elements. The switching system 10 further comprises a trigger module 13 which generates a trigger signal in order to switch between the multiple signal paths. In FIG. 1, the switching system is illustrated as a full access configuration where any input $11_1$, $11_2$, ..., $11_N$ can connect to any output $12_1$, $12_2$, ..., $12_N$ to achieve simultaneous operation of multiple active channels. However, it is also possible to implement a common highway configuration utilizing a plurality of multiplexers/de-multiplexers in order to achieve multiple active channels. The switching elements are preferably radio frequency switches that are generally rated for more than 10 MHz or 20 MHz and typically have lower channel density to preserve signal integrity.

It is advantageous that the multiple signal paths are programmable and can be altered based on a detected trigger signal. A control unit 15 receives the trigger signal form the trigger module 13 and examines the trigger signal with an adjustable threshold to identify a signal level change. The path switching sequence is predetermined and when the control unit 15 detects a trigger signal, the subsequent signal path is switched. Furthermore, the length of the switching sequence is definable, that is a finite number of sequences are assigned and the control unit 15 is adapted to reset the switching sequence eventually or abruptly based on the requirements of a particular measurement setup.

In addition, multiple trigger signals can be generated by the trigger module 13. The multiple signal paths are further assigned by location indexes based on the number of generated trigger signals. An N number of trigger signals correspond to $2^N$ number of location indexes, each assigned to a corresponding signal path. In this context, the control unit 15 examines each of the trigger signals and upon detecting the trigger signals the signal path equivalent to the respective location index is switched. Therefore, arbitrary switching between the signal paths is possible by generating multiple trigger signals to directly address a specific signal path.

The switching system 10 further comprises a graphical user interface 17 connected to the control unit 15. Preferably, the graphical user interface 17 comprises menu based interfaces and direct manipulation interfaces so as to facilitate the users to configure the switching system 10 to meet their specific requirements in diverse test circumstances. The control unit 15 also outputs a ready signal to the graphical user interface 17 in order to indicate a correct switching from one signal path to the subsequent signal path. The ready signal may be displayed as a graphical element (icon) on the graphical user interface 17 or as a light emitting diode (LED) indication.

In FIG. 2, a first exemplary test setup of the switching system 10 performing switching operation in over the air measurements is illustrated. The switching system 10 connects a measuring unit 22 to a plurality of test antennas $21_1$, $21_2$, . . . , $21_N$ so as to define multiple radio frequency signal paths. The test antennas $21_1$, $21_2$, . . . , $21_N$ may transmit and/or receive test signals from various user equipment $23_1$, $23_2$ and the switching system 10 executes sequential switching of the signal paths to perform measurement on the user equipment $23_1$, $23_2$ simultaneously. Generally, the test antennas $21_1$, $21_2$, . . . , $21_N$ and the user equipment $23_1$,$23_2$ are located in a test chamber 25, for instance, an anechoic chamber to simulate multipath propagation in over the air test setups.

In FIG. 3, a second exemplary test setup of the switching system 10 performing switching operation in over the air measurements is illustrated. The test setup differs from the test setup illustrated in FIG. 2 in that a plurality of measuring units $22_1$, $22_2$, . . . , $22_N$ are connected to the plurality of test antennas $21_1$, $21_2$, . . . , $21_N$ through the switching system 10.

In FIG. 4, a flow chart of an exemplary embodiment of the inventive method according to the second aspect of the invention is illustrated. In a first step 100, multiple signal paths are defined corresponding to specific switch positions of a plurality of switching elements. In a second step 101, a trigger signal is generated in order to switch between the multiple signal paths.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

What is claimed is:

1. A switching system for sequential switching of radio frequency paths comprising:
    a plurality of inputs and a plurality of outputs,
    a plurality of switching elements respectively connected between the plurality of inputs and the plurality of outputs, and
    a trigger module,
    wherein multiple signal paths are defined between the plurality of inputs and the plurality of outputs corresponding to specific switch positions of the plurality of switching elements,
    wherein the trigger module is adapted to generate a trigger signal in order to switch between the multiple signal paths,
    wherein the switching system further comprises a control unit configured to examine the trigger signal with an adjustable threshold to identify a signal change in order to detect the trigger signal, thereby switching the multiple signal paths based on the detected trigger signal, and
    wherein the control unit is further configured to output a ready signal on a user interface in order to indicate a correct switching from one signal path to a subsequent signal path.

2. The switching system according to claim 1,
    wherein the multiple signal paths are switched in a predefined path sequence.

3. The switching system according to claim 1,
    wherein the control unit is further configured to switch the subsequent signal path corresponding to the predefined path sequence upon detecting the trigger signal.

4. The switching system according to claim 1,
    wherein the control unit is further configured to switch the multiple signal paths in real-time.

5. The switching system according to claim 1,
    wherein the control unit is further configured to reset the predefined path sequence of the multiple signal paths.

6. The switching system according to claim 1,
    wherein the trigger module is further adapted to generate a number N of trigger signals, and
    wherein the multiple signal paths are assigned by $2^N$ location indexes.

7. The switching system according to claim 6,
    wherein the control unit is further configured to examine each number N of trigger signals with a respective adjustable threshold to identify signal change in order to detect the number N of trigger signals.

8. The switching system according to claim 6,
    wherein the control unit is further configured to switch a subsequent signal path corresponding to the $2^N$ location indexes upon detecting the respective number N of trigger signals.

9. The switching system according to claim 1,
    wherein the user interface is a graphical user interface.

10. A method for sequential switching of radio frequency paths comprising the steps of:
- defining multiple signal paths corresponding to specific switch positions of a plurality of switching elements,
- generating a trigger signal in order to switch between the multiple signal paths,
- examining the trigger signal with an adjustable threshold to identify a signal change in order to detect the trigger signal,
- switching the multiple signal paths based on the detected trigger signal, and
- outputting a ready signal in order to indicate a correct switching from one signal path to a subsequent signal path.

11. The method according to claim 10,
wherein the method further comprises the step of switching the multiple signal paths in a predefined sequence.

12. The method according to claim 10,
wherein the method further comprises the step of switching the subsequent signal path corresponding to the predefined path sequence upon detecting the trigger signal.

13. The method according to claim 10,
wherein the method further comprises the step of switching the multiple signal paths in real-time.

14. The method according to claim 10, wherein the method further comprises the steps of:
generating a number N of trigger signals, and
assigning the multiple signal paths by $2^N$ location indexes.

15. The method according to claim 14,
wherein the method further comprises the step of examining each number N of trigger signals with a respective adjustable threshold to identify signal change in order to detect the number N of trigger signals.

16. The method according to claim 14,
wherein the method further comprises the step of switching a subsequent signal path corresponding to the $2^N$ location indexes upon detecting the respective number N of trigger signals.

* * * * *